(12) United States Patent
Nakatsuka (10) Patent No.: US 7,888,146 B2
(45) Date of Patent: Feb. 15, 2011

(54) METHOD FOR ASSEMBLING ARRAY-TYPE SEMICONDUCTOR LASER DEVICE

(75) Inventor: Shinichi Nakatsuka, Tokyo (JP)

(73) Assignee: Ricoh Company, Ltd., Ohta-ku, Tokyo (JP)

( * ) Notice: Subject to any disclaimer, the term of this patent is extended or adjusted under 35 U.S.C. 154(b) by 253 days.

(21) Appl. No.: 12/219,133

(22) Filed: Jul. 16, 2008

(65) Prior Publication Data

US 2009/0042327 A1 Feb. 12, 2009

(30) Foreign Application Priority Data

Jul. 17, 2007 (JP) .......................... P2007-185988

(51) Int. Cl.
*H01L 21/00* (2006.01)

(52) U.S. Cl. ................. 438/25; 438/455; 257/E21.499; 257/E21.509

(58) Field of Classification Search .................. 438/22, 438/25, 31, 32, 39, 455, 456, 464; 257/E21.499, 257/E21.509
See application file for complete search history.

(56) References Cited

U.S. PATENT DOCUMENTS

| | | | | |
|---|---|---|---|---|
| 5,357,536 A | * | 10/1994 | Andrews | ................. 372/50.12 |
| 5,994,204 A | * | 11/1999 | Young et al. | ................. 438/455 |
| 6,829,265 B2 | * | 12/2004 | Nakatsuka et al. | ............. 372/36 |
| 6,888,870 B2 | * | 5/2005 | Makita et al. | ............. 372/44.01 |
| 7,272,161 B1 | * | 9/2007 | Chen et al. | ................. 372/107 |
| 2004/0161010 A1 | * | 8/2004 | Matsumura | ................. 372/46 |
| 2006/0258120 A1 | * | 11/2006 | Gilroy et al. | ................. 438/455 |

FOREIGN PATENT DOCUMENTS

| JP | 6-334274 | 12/1994 |
|---|---|---|
| JP | 2006-24665 | 1/2006 |

* cited by examiner

*Primary Examiner*—Khiem D Nguyen
(74) *Attorney, Agent, or Firm*—McGinn IP Law Group, PLLC

(57) ABSTRACT

According to an aspect of the present invention, there is provided a method for assembling a semiconductor laser device, including: preparing a laser chip including: a substrate; stripe waveguides that are formed on the substrate and that each includes a gain producing area and a window area; electrodes formed on the stripe waveguides; an insulating layer formed on the electrodes; a metal layer formed on the insulating layer; projections arranged at an interval in the window areas; and joining structures connected to the electrodes and formed in the window areas; preparing a submount including: a first solder; second solders arranged at the interval; and submount electrodes connected to the second solders; contacting the laser chip to the submount by fitting the projections with respect to the second solders; and heating the submount and the laser chip.

12 Claims, 12 Drawing Sheets

METHOD FOR ASSEMBLING ARRAY-TYPE SEMICONDUCTOR LASER DEVICE

CROSS-REFERENCE TO RELATED APPLICATIONS

The entire disclosure of Japanese Patent Application No. 2007-185988 filed on Jul. 17, 2007 including specification, claims, drawings and abstract is incorporated herein by reference in its entirety.

BACKGROUND OF THE INVENTION

1. Field of the Invention

An aspect of the present invention relates to a method for assembling an array-type semiconductor laser device and, more particularly, method for assembling an array-type semiconductor laser device used as a light source of a laser beam printer, a laser copying machine, or the like and having a plurality of light emission spots aligned in such a way that an interval between laser light sources is at a narrow interval of 30 μm or less.

2. Description of the Related Art

In order to speed up the laser beam printer, it is effective to scan a plurality of laser beams simultaneously. The array-type semiconductor laser, in which a plurality of laser resonators are integrated in a semiconductor laser chip, enables a single optical system to scan a plurality of beams and thus is a useful device as the light source for the high-speed printer.

Normally, the semiconductor laser is formed by growing epitaxially the so-called "double hetero structure", in which a semiconductor layer with a narrow band gap is put between semiconductor layers having a different conductivity and a wide band gap respectively, on the principal plane of the semiconductor substrate crystal. The heat generation when a current is supplied in operating the laser is caused mainly in this portion of the double hetero structure. Therefore, in order to radiate the heat effectively, the side surface of the laser chip, on which the double hetero structure is formed, must be bonded onto the plate material that is called the submount and is formed of the high heat-conductive insulator. Such semiconductor laser assembling approach is called the "junction down assembling".

In the case of the semiconductor laser for the printer, it is requested that an operating current must be suppressed low and a laser beam must be radiated in a fundamental lateral mode. Therefore, the double hetero structure must be provided in the direction perpendicular to the substrate plane and also the stripe-like waveguide structure for propagating only in the direction perpendicular to the traveling direction of the laser beam on the plane that is coplanar to the substrate plane must be provided. In the case of the array-type semiconductor laser, it is needed that a plurality of such stripe-like waveguide structures should be provided in a single laser chip and be caused to each oscillate the laser beam independently. In the junction down assembling, it is difficult to provide the channels at a narrow interval of 30 μm or less because short-circuit may arise between the neighboring electrodes of the stripe-like waveguide structures when the submount and the laser chip are soldered.

As the approach of scanning the neighboring scanning lines, i.e., the scanning lines arranged at the same interval as the size of the light spot, by the laser array of a wide-interval beam spots, such a system is employed that the line along which spots of the array-type semiconductor laser are aligned is scanned by inclined slightly with respect to the direction of the scanning line. However, since an inclination of the alignment line of the laser array from the scanning line is minute, an angular control is difficult in this system. For this reason, the laser array of a narrow-interval beam spots is needed.

Also, in order to implement the higher printing speed, an increase of the channel number (e.g., 20 channels or more) is required of the array-type semiconductor laser. In the case where the channel interval is 30 μm or more, the light emission spots are interspersed along a range of 600 μm. As a result, it is difficult to converge all light emission spots into a good shape by a single optical system and also keep a parallelism of the scanning lines.

Figure 1:
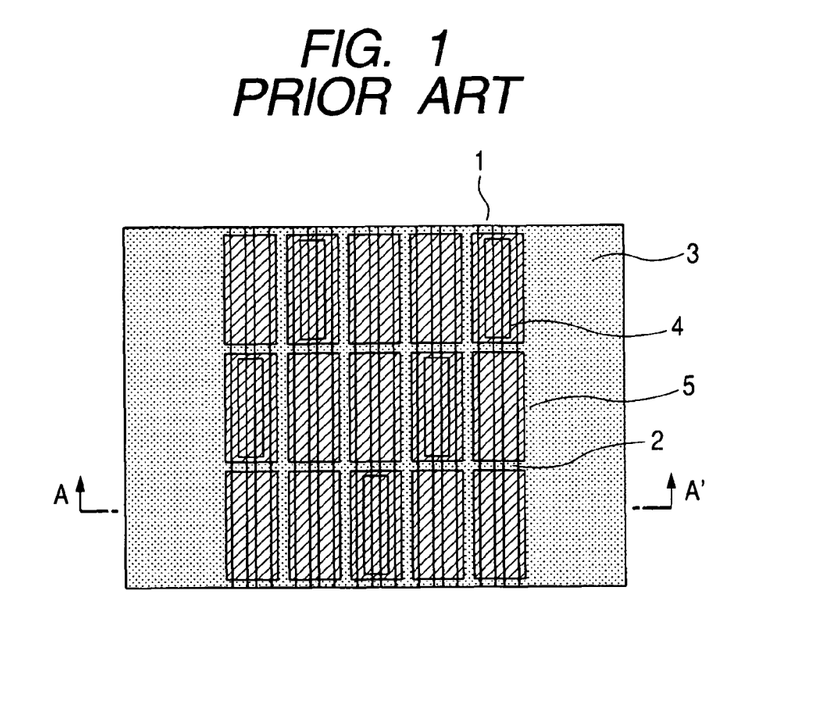
FIG. 1 is a top view of the related-art laser chip.
Figure 2:
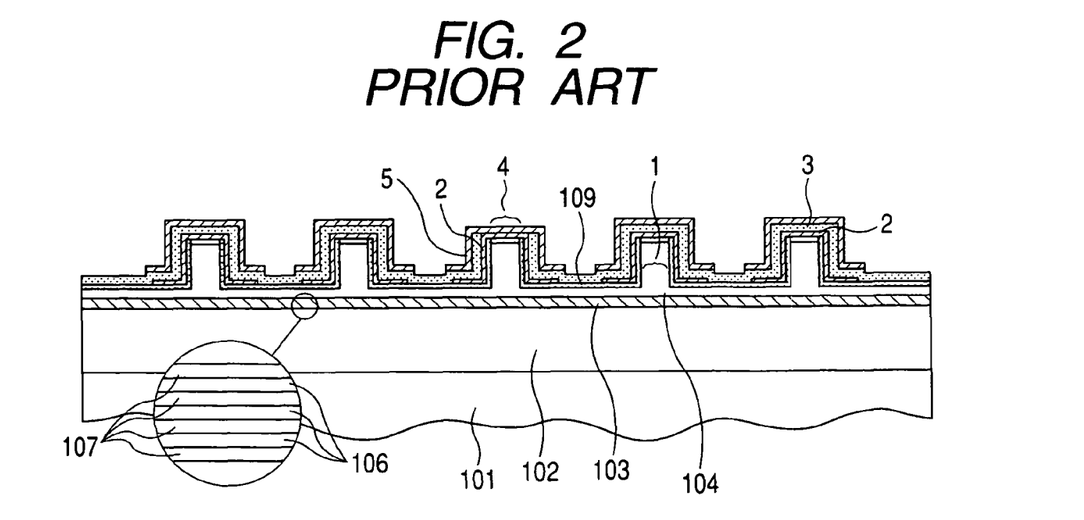
FIG. 2 is a sectional view of the related-art laser chip.

JP-2006-24665-A discloses the array-type semiconductor laser having the upper surface structure shown in FIG. 1 and the sectional structure shown in FIG. 2. FIG. 2 is a sectional view taken along an A-A' line in FIG. 1. In this structure, stripe-like waveguide structures 1 each constituting the resonator of the semiconductor laser, first electrodes 2 provided in the direction parallel with the stripe-like waveguide structures 1 to cover the structures 1 and separated electrically, and an insulating film 3 for covering them are formed, then holes 4 for supplying a power are opened in a part of the insulating film 3, then second electrodes 5 split in the direction intersecting with the stripe-like waveguide structures are provided, and then submount electrodes 9 each having a different shape from the second electrodes 5 and formed of an electrode layer 7 and a solder layer 8 are provided on a submount 6 shown in FIG. 3. When the second electrodes 5 and the submount electrodes 9 having such structures are joined with solder, alignment accuracy in the junction down assembling is decided depending on the interval of the second electrodes 5. Therefore, the channel interval of the array laser can be narrowed up to the limit of the lithography technology, while the heat radiating characteristic can be maintained good because the heat generated in the stripe-like waveguide structure portions when a power is fed is radiated from the second electrodes 5 to the submount 6 via the thin insulating film 3.

Figure 3:
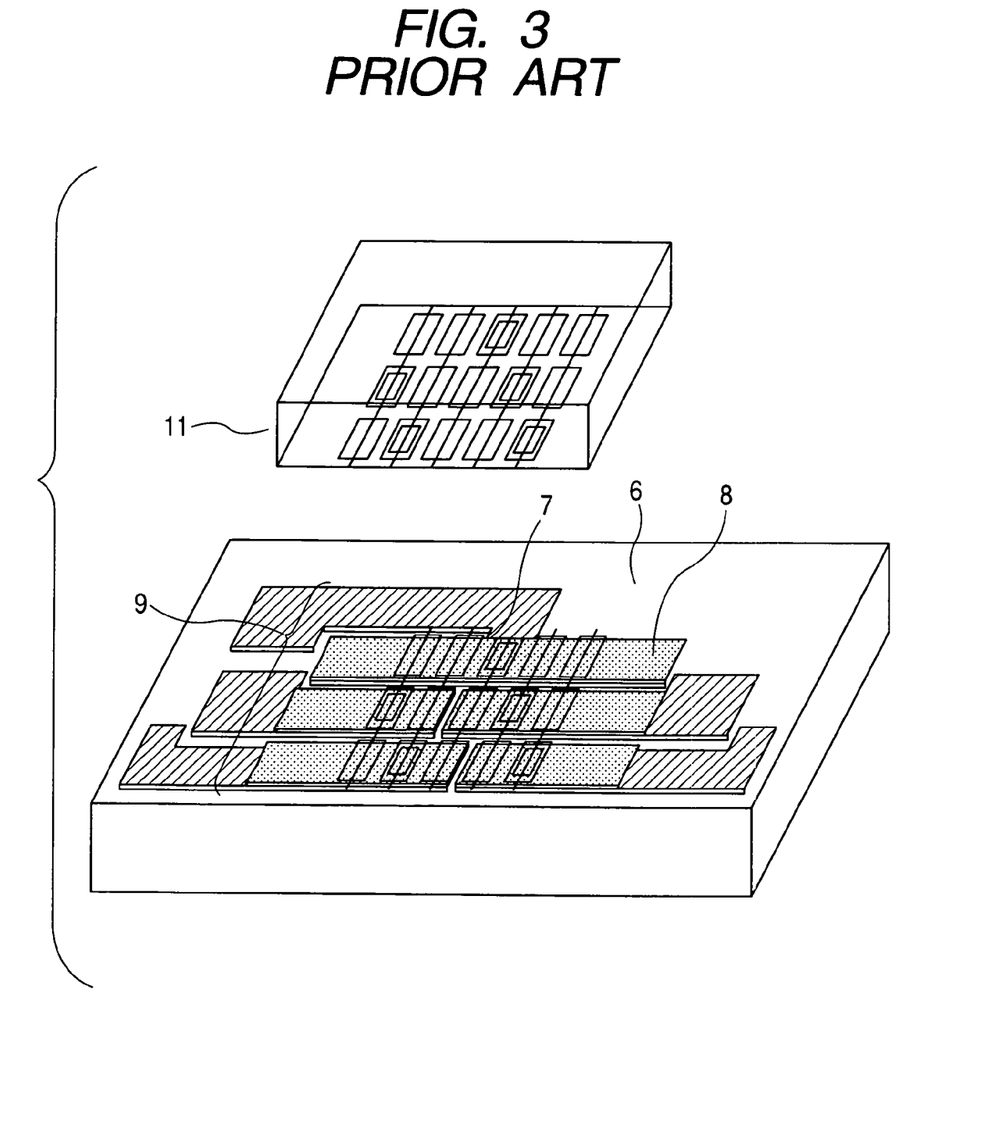
FIG. 3 shows an assembling operation of the related-art semiconductor laser.

In FIG. 1, FIG. 2, and FIG. 3, a reference 101 denotes an n-type GaAs substrate, a reference 102 denotes an n-type $(Al_{0.7}Ga_{0.3})_{0.5}In_{0.5}P$ cladding layer, a reference 103 denotes a multiple quantum well active layer whose number of wells is 3, a reference 104 denotes a p-type $(Al_{0.7}Ga_{0.3})_{0.5}In_{0.5}P$ cladding layer, and a reference denotes a p-GaAs cap layer 105. The multiple quantum well active layer 103 is constructed by a $Ga_{0.3}In_{0.5}P$ strained quantum well layer (undoped) 106, and a $(Al_{0.5}Ga_{0.5})_{0.5}In_{0.5}P$ barrier layer (undoped) 107 of 5 nm thickness.

Figure 4:
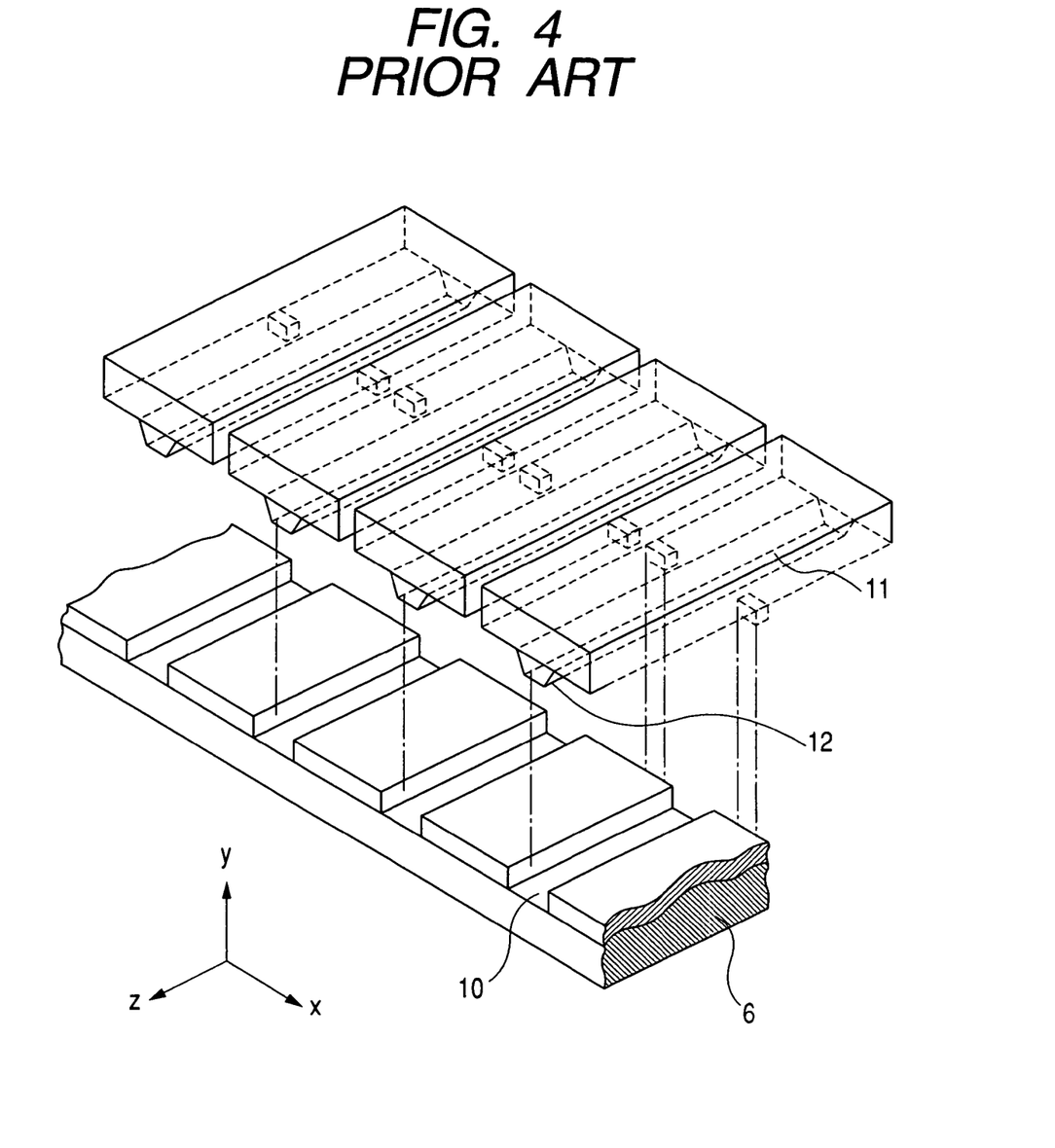
FIG. 4 shows an assembling operation of the related-art semiconductor laser.

As the approach of executing a precise alignment while preventing the short-circuit of the array-type semiconductor laser, JP-H06-334274-A discloses that projection portions 12 of laser chips 11 are fitted into a recess-like matching structure 10 that is provided to the submount 6 and extended in the same direction as the stripe-like waveguide structure 1, as shown in FIG. 4. The structure has features that the position of the stripe-like waveguide structure 1 can be decided with good accuracy by the physical fitting of the projection portions 12 into the recess-like matching structure 10 and the laser arrays provided separately and having the different characteristic respectively can be aligned with good interval accuracy.

According to JP-2006-24665-A, the laser array whose channel interval is narrowed up to the limit of the lithography technology can be implemented. In this case, the second electrodes 5 are split in the length direction of the stripe-like waveguide structure 1, and thus the number of arrays is restricted by the interval of the second electrodes. Since the optimum value necessary for the compatibility between a low operating current and high reliability exists in the length of the waveguide of the laser array, it is difficult to adjust a length of the resonator in accordance with the number of arrays. In the case of this structure, the alignment in the direction intersecting orthogonally with the waveguides is also needed to control positions of the light emission spots, and the two-directional adjustment is required.

Meanwhile, according to JP-H06-334274-A, a plurality of array-type lasers can be aligned with good accuracy. In this case, the alignment accuracy is high but position control in the fitting operation is difficult when a play between the recess and the projection is small, while the alignment in the fitting operation becomes easy but there existed such a problem that an error occurs in positional accuracy in the completed structure when a play between the recess and the projection is large. Also, when the interval of the array lasers is narrow, the projection portions of the laser chip run up onto the projection portions of the submount in the fitting operation on account of displacement between the chip and the submount in the rotational direction. Therefore, not only the fitting operation becomes difficult but also a part of the laser chip, especially a part of the stripe-like waveguide structure 1, is sometime damaged.

SUMMARY OF THE INVENTION

In the present invention, the window area in which the absorption of the laser beam is not caused unless the power is supplied is formed on a part of the semiconductor laser waveguides, and the joining structures for connecting electrically the laser chip and the submount are formed in the window areas. As the concrete joining structures, the projections made of a resin such as polyimide, or the like or the multi-layered wiring structure consisting of the insulator and the metal may be used. When such structures are provided on the semiconductor laser, the heat radiating performance of these portions becomes worse considerably rather than other portions. However, as long as these structures are provided in the window area, since there is no need to supply the power, such disadvantage is not caused and thus the good device characteristic can be maintained.

According to the present invention, the semiconductor laser having multiple beams, the interval of which is narrow and the channel number of which is increased up to several tens, at a narrow pitch can be mounted with good yield and with good positional accuracy.

BRIEF DESCRIPTION OF THE DRAWINGS

Embodiments of the present invention will be described in detail based on the following figures, wherein.

DETAILED DESCRIPTION OF THE INVENTION

In the present invention, a part of the area of the stripe-like waveguide structure of the semiconductor laser is formed as a window area transparent to the laser beam, by utilizing the disordering of the quantum well structure by diffusing zinc. Generally, the window area is formed near the end surface of the semiconductor laser to prevent the edge breakdown phenomenon and formed so that a band gap is enlarged as compared with the band gap corresponding to an oscillation frequency of the semiconductor laser. This area is formed by the disordering of the quantum well structure by the impurity diffusion or ion implantation, diffusing vacancies from the insulating film, removing the active layer from the light emission region, re-growing the crystal whose band gap is set wider, or the like. The window area in the present invention can be formed by any of these processes. The quantum well disordering using the zinc diffusion will be explained in following embodiments by way of example. In the related-art semiconductor laser, such structure is provided only in vicinity of the end surface. In the present invention, such structure is formed over a length of 30 to 200 μm in the direction along which the stripe-like waveguide structure is extended because this structure is used as the waveguide that has no light absorption in a non-energized state.

When the non-energized area is present in a part of the stripe-like waveguide structure of the semiconductor laser, such area strongly absorbs the laser beam. For this reason, normally the structure in which the almost whole waveguide is energized is employed. However, since the light absorption does not occur in the above window area in the non-energized state, the relatively long area (e.g., 50 μm or more) of the stripe-like waveguide structure can be used as the non-energized area. In this case, the heat generation due to the energization does not occur in the non-energized window area, there is no necessity to keep the good heat radiation performance unlike the stripe-like waveguide structure that is to be energized. Therefore, even the structure made of the material having a low heat conductivity such as the organic substance, or the like and used for alignment or the multi-layered wiring structure, which causes trouble when such structure is provided near the stripe-like waveguide structure that is to be energized normally, can be provided in this area. As a result, the method for assembling the narrow-interval multi-element array laser with high yield by utilizing the structure that is provided in such window area and used for precise alignment can be implemented. A device structure and an assembling method will be explained hereinafter.

Embodiment 1

Embodiment 1 of the present invention will be explained with reference to FIGS. 5 to 11 hereunder. In the embodiment, an array-type semiconductor laser device shown in FIG. 10 is manufactured. In this laser device, a semiconductor laser chip 121 having 40 stripe-like waveguide structures 111, which can be driven individually, formed in the same chip is mounted on a submount 124 with solder. This submount 124 supports the laser chip and has a function of radiating the heat generated in the laser chip.

Figure 5:
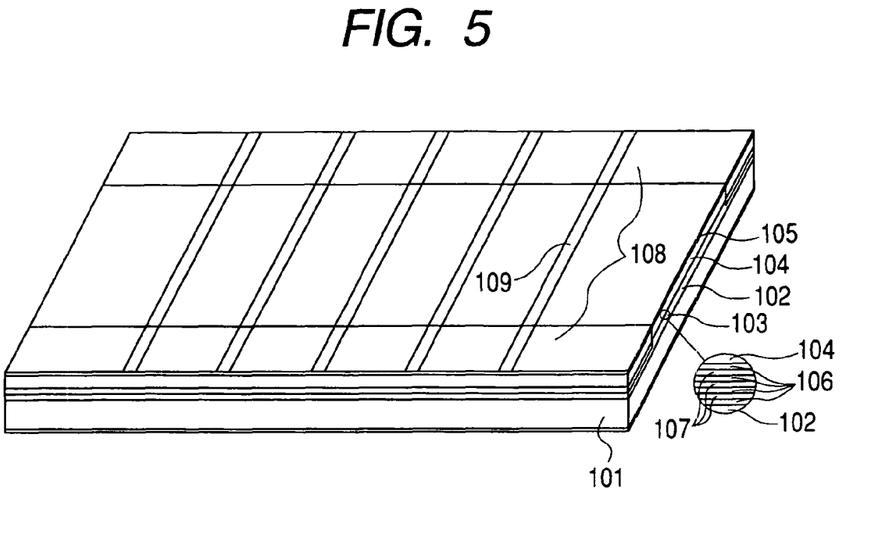
FIG. 5 is a perspective view of a structure after a mask for forming a waveguide structure of a laser in a first embodiment is formed.

In this structure, as shown in FIG. 5, first the double hetero structure is formed by growing sequentially the n-type $(Al_{0.7}Ga_{0.3})_{0.5}In_{0.5}P$ cladding layer ($n=1\times10^{18}$ cm$^{-3}$) 102 of 1.8 μm thickness, the multiple quantum well active layer 103 whose number of wells is 3, the p-type $(Al_{0.7}Ga_{0.3})_{0.5}In_{0.5}P$ cladding layer ($p=7\times10^{17}$ cm$^{-3}$) 104, and the p-GaAs cap layer ($p=3\times10^{18}$ cm$^{-3}$) 105 of 0.4 μm thickness on the n-type GaAs substrate 101 ($n=1\times10^{18}$ cm$^{-3}$) that is off by 10° from a (100) face in the [011] direction, by the metal organic chemical vapor deposition method. The multiple quantum well active layer 103 is constructed by the strained quantum well layer (undoped) 106 of 5 nm thickness, and the $(Al_{0.5}Ga_{0.5})_{0.5}In_{0.5}P$ barrier layer (undoped) 107 of 5 nm thickness. Then, the zinc diffusion is applied to the areas corresponding to 100 μm from both ends of the laser chip respectively by using zinc oxide as a diffusion source, and thus window areas 108 in which the multiple quantum well active layer 103 is disordered are formed on this structure. At this time, a total length of the stripe-like waveguide structure 111 is set to 400 μm, and the area of 200 μm except the window areas 108 corresponds to the area that produces a gain by the energization.

A SiO$_2$ film (not shown) of 200 nm thickness is stacked on a surface of this double hetero substrate by the thermal CVD method. Then, the SiO$_2$ film is shaped into stripe-like shapes that are extended in the [01(−1)] direction by the photolithography technology, and thus SiO$_2$ masks 109 are formed.

Figure 6:
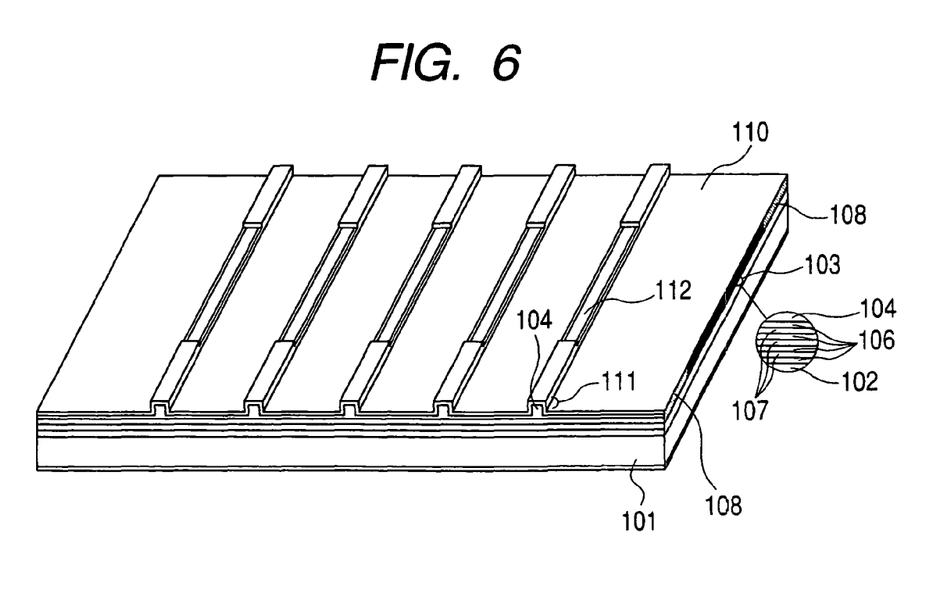
FIG. 6 is a perspective view of a structure after opening portions of the laser in the first embodiment are formed.

This wafer is processed into a structure shown in FIG. 6 by executing processing steps described in the following. First, the dry etching is applied by the reactive ion etching while using the above stripe-like SiO$_2$ masks 109 (shown in FIG. 5) as a mask until the p-type second cladding layer 104 of about 0.35 μm thickness is left on the multiple quantum well active layer 103.

Then, the SiO$_2$ masks 109 left on the ridges are removed, and a SiO$_2$ protection film 110 is formed on the whole surface by using the plasma CVD method. In the embodiment, a film thickness of the SiO$_2$ protection film 110 is set to 250 nm or less. In this case, other insulating film except the SiO$_2$ film, e.g., a SiN or Al$_2$O$_3$ film, may be employed. The SiO$_2$ protection film 110 has an opening portion 112 on the stripe-like waveguide structures 111 formed by the dry etching respectively. A perspective view of the area corresponding to the laser chip is shown in FIG. 6.

Figure 7:
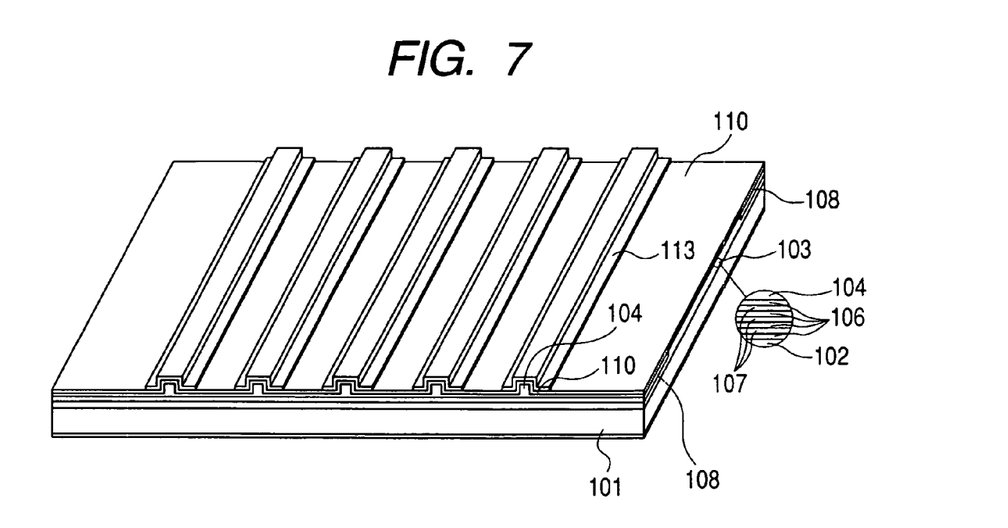
FIG. 7 is a perspective view of a structure after first electrodes of the laser in the first embodiment are formed.

By reference to FIG. 7, a p-side first electrode 113 is formed by stacking a Ti (titanium) deposited electrode (not shown), an Au (gold) deposited electrode (not shown), and a Mo (molybdenum) deposited electrode (not shown) in order by using the EB deposition method, or the like. In the opening portion 112, the p-GaAs cap layer 105 contacts the p-side first electrode 113 provided on the SiO$_2$ protection film 110. In the embodiment, a barrier metal layer may be formed between the Ti deposited electrode and the Au deposited electrode by using Pt (platinum), or the like. Then, the p-side first electrode 113 is processed into respective shapes, which extend in the direction parallel with the laser waveguides and cover individual laser waveguides, by the lithography technology and the ion milling technology. A perspective view of the laser chip at this stage is shown in FIG. 7.

Figure 8:
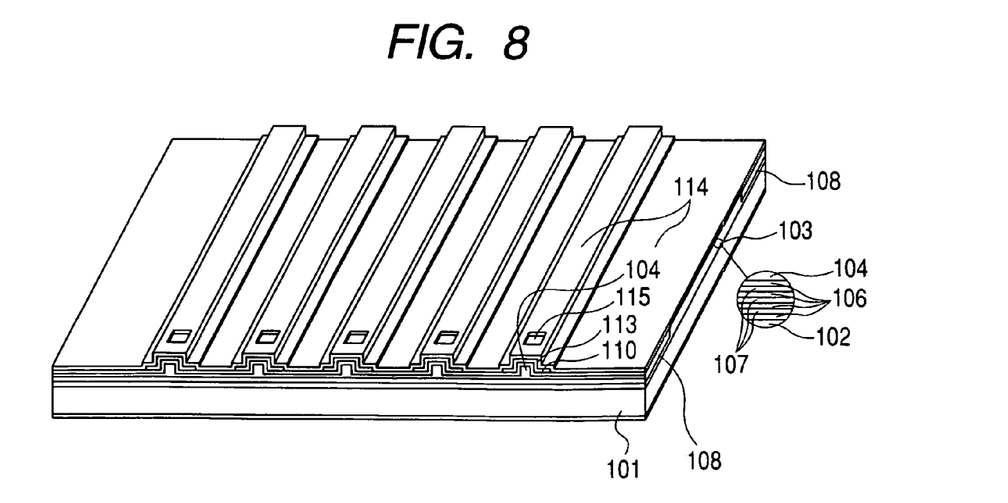
FIG. 8 is a perspective view of a structure after contact holes of the laser in the first embodiment are formed.

By reference to FIG. 8, then a SiO$_2$ interlayer insulating film 114 is formed on this structure by the plasma CVD method. Then, the SiO$_2$ interlayer insulating film 114 is removed from one area on each of p-side first electrodes 113, and thus contact holes 115 from which the p-side first electrode 113 is exposed respectively are formed. Thus, a structure shown in FIG. 8 is formed.

Figure 9:
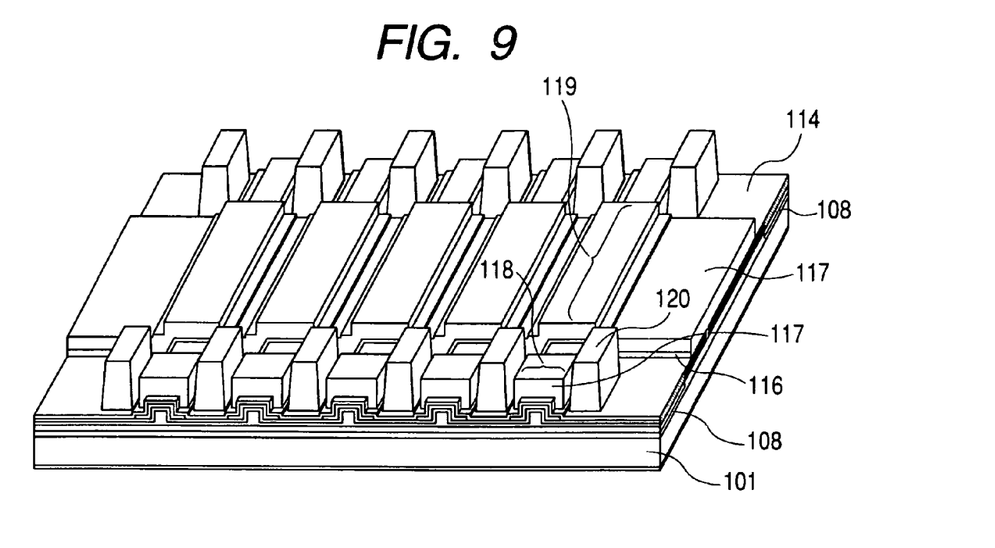
FIG. 9 is a perspective view showing a completed laser chip in the first embodiment.
Figure 10:
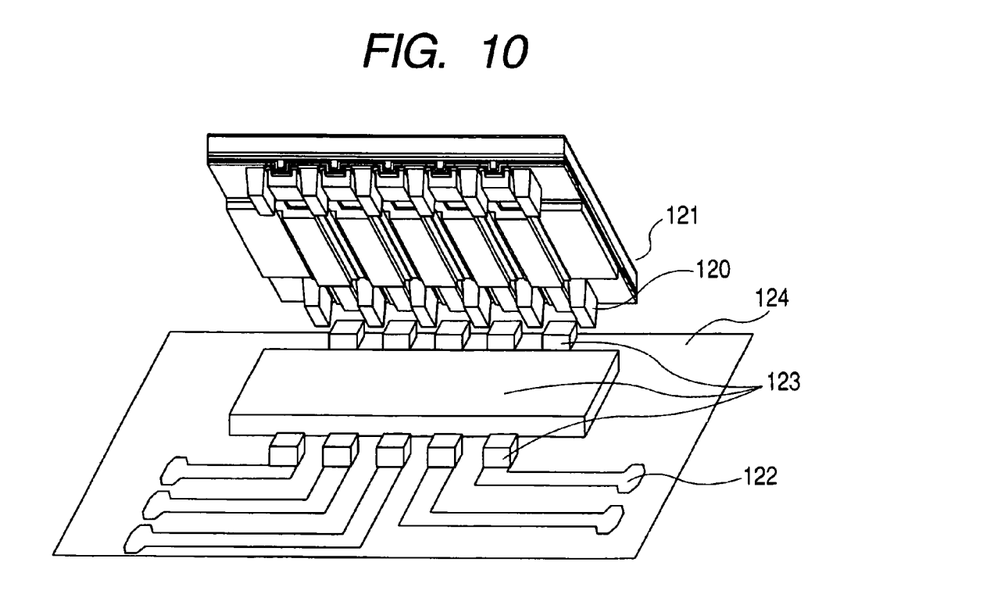
FIG. 10 shows an assembling operation of the first embodiment.

By reference to FIG. 9, then second electrodes 116 are formed by forming a Ti (titanium) deposited electrode (not shown) and an Au (gold) deposited electrode (not shown) in order by using the EB deposition method, or the like. Then, a resist mask is formed on the electrodes by the photolithography technology, and then plated electrodes 117 are formed by plating a gold up to a thickness of 3 μm. Then, the photoresist is removed, and then the second electrodes 116 are removed by the ion milling while using the gold plated electrodes 117 as a mask. The plated electrodes 117 are divided into two structures. The plated electrode 117 are provided in the window areas 108 as a joining structure 118 for electrically connecting with the submount side electrode, and provided in areas except the windows to cover the stripe-like waveguide structures as a chip fixing structure 119 for fixing the laser chip onto the submount and for releasing the heat of the waveguide to the submount but not for energizing the waveguide. Each of the joining structures 118 is connected to the p-side first electrode 113, which covers each laser waveguide, via the contact hole 115. Individual laser waveguide portions oscillate the laser beam when the current is supplied to the gain generating area of the multiple quantum well active layer 103 by feeding the current via the electrodes provided on the back surface of the n-type GaAs substrate 101.

Then, a conductive polyimide resin is coated on areas between the laser waveguides in the window areas of this structure, and then projections 120 used for alignment and each having a height of 6 μm and a width of 6 μm are provided by processing this polyimide resin by the lithography technology. Thus, the structure shown in FIG. 9 is formed. These projections 120 are formed in the window areas in front of and at the back of the semiconductor lasers at a given pitch respectively, but are not formed in portions except the window areas. The projection 120 has a tapered-down shape whose sectional shape is a trapezoid or a triangle.

As shown in FIG. 10, the laser chip 121 manufactured in this manner is bonded onto the submount 124 that has patterns of submount electrodes 122 and solder layers 123 corresponding to respective electrodes thereon to direct the joining surface downward. The patterns of the solder layers 123 provided on the submount 124 consist of a large-area solder layer, which is provided to cover the stripe-like waveguide structures in the area of the laser chip 121 except the window areas and corresponds to the chip fixing structures 119, and a plurality of small-area solder layers, which are provided beside that solder layer at a given pitch. An alignment pitch of the small-area solder layers matches with an alignment pitch of the projections that are provided in the window areas of the laser chip 121.

Figure 11:
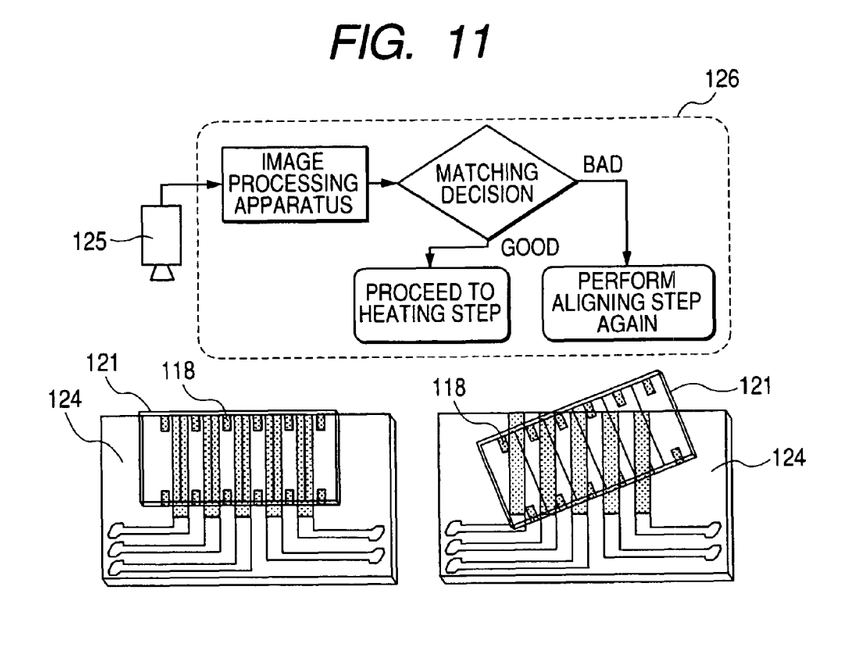
FIG. 11 is an assembling controlling system of the first embodiment.

The bonding step applied at this time will be explained with reference to FIG. 11 hereunder. In the present step, the laser chip 121 whose joining surface is directed downward is held to oppose to the submount 124, then is brought once into contact with the submount 124 to check that the projections 120 provided for the purpose of alignment and made of polyimide are matched correctly, and then a load of 10 g is applied to the laser chip 121 to temporarily bond the solder and the plated electrode. At this time, the polyimide projections 120 and the solder layers 123 are formed into a upward-tapered shape respectively. Therefore, when a displacement occurs between their alignment positions, such displacement is corrected automatically by the engagement between both members. Since such polyimide projections 120 and the solder layers 123 are formed only on both end portions of the laser chip, such a problem mentioned above does not arise that the projection portions 120 of the laser chip run up onto the solder layers 123.

Also, the polyimide projections 120 and the solder layers 123 of the submount are formed periodically. Therefore, when the solder layers 123 are fitted into the areas between the adjacent projections 120 due to the displacement between their alignment positions, the positions of the laser chip 121 and the submount 124 are displaced by a discrete angle. Consequently, if an assembling step controlling system 126 for monitoring the assembling operation by a monitor camera 125 and carrying out the aligning operation again when the displacement is detected is installed, the semiconductor laser device can be easily assembled. The gold plated electrodes 117 and the solder layers 123 are alloyed when a temperature of the submount 124 and the laser chip 121 is increased in excess of a fusing temperature of the solder layers 123 in a state that the temporary bonding is completed, and thus the laser chip 121 and the submount 124 can be joined with good uniformity.

In the embodiment, a plurality of solder layers aligned at a given pitch and having a small area are provided in two rows on the submount 124. The solder layers in row have a function of aligning the laser chip 121 with the submount 124 when they are engaged with the polyimide projections 120 provided in the window areas of the laser chip 121, and a function of feeding a power to individual laser waveguides of the laser chip 121 when they are joined to the joining structure 118 of the laser chip 121 respectively. In contrast, the solder layers aligned at a given pitch in the other row have only a function of aligning the laser chip 121 with the submount 124 when they are engaged with the polyimide projections 120 provided in the window areas of the laser chip 121.

In the above explanation, the array laser having 5 channels is illustrated to avoid complexity of the drawings. However, the multi-channel array laser having 40 channels and the spot interval of 15 μm can be manufactured by using the similar configuration with good yield.

Embodiment 2

Figure 12:
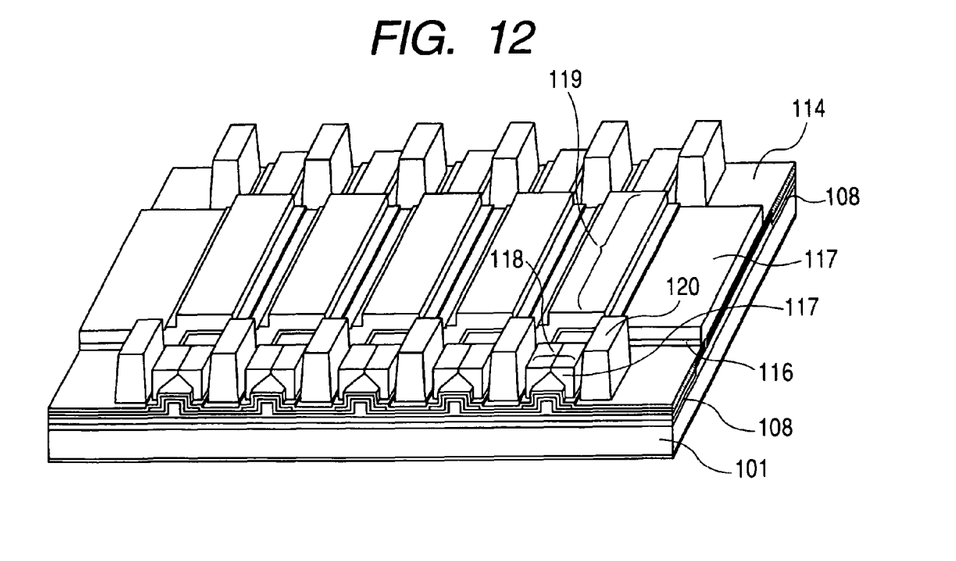
FIG. 12 is a perspective view showing a completed laser chip in a second embodiment.

In the above structure, in order to prevent the contact failure of the joining structure 118 in the solder joining, the joining structure 118 may be formed as the structure in which cavities 201 are provided in the interior, as shown in FIG. 12. Such structure is formed by providing a photoresist mask whose width is narrower than a plated thickness in forming the plated electrodes and then removing the plated electrodes by an organic solvent after the plating is completed. When such structure is formed higher than a height of the gold plating of the chip holding electrodes from the substrate surface, this structure is deformed by a load applied in temporarily bonding the submount and the laser chip, and thus the joining between the fixed electrodes and the joined electrodes can be implemented with good reproducibility. As a result, the contact failure due to unevenness of the soldering can be prevented.

Embodiment 3

Figure 13:
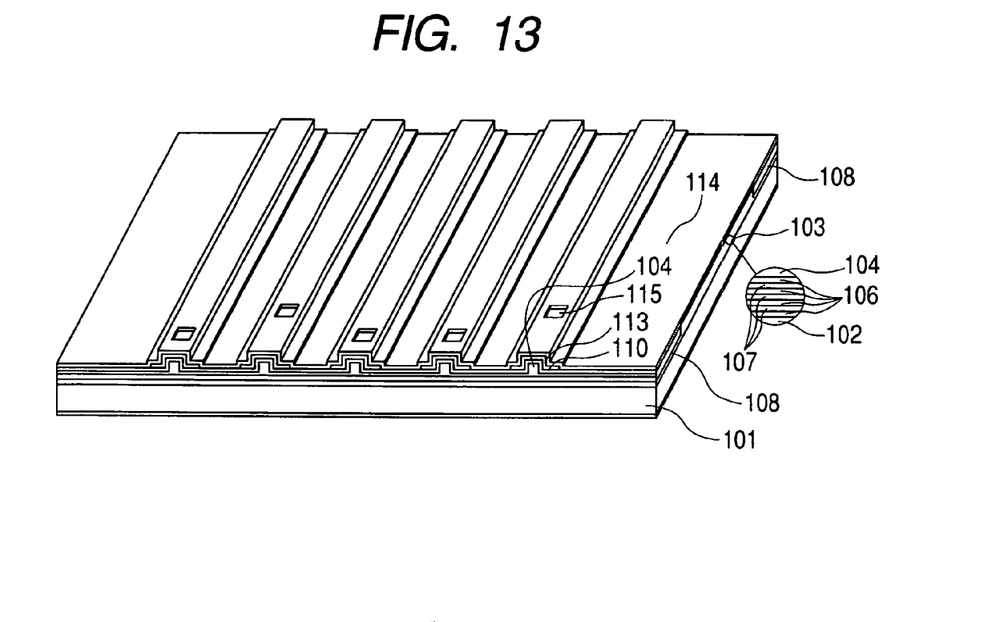
FIG. 13 is a perspective view of a structure after contact holes of a laser in a third embodiment are formed.
Figure 14:
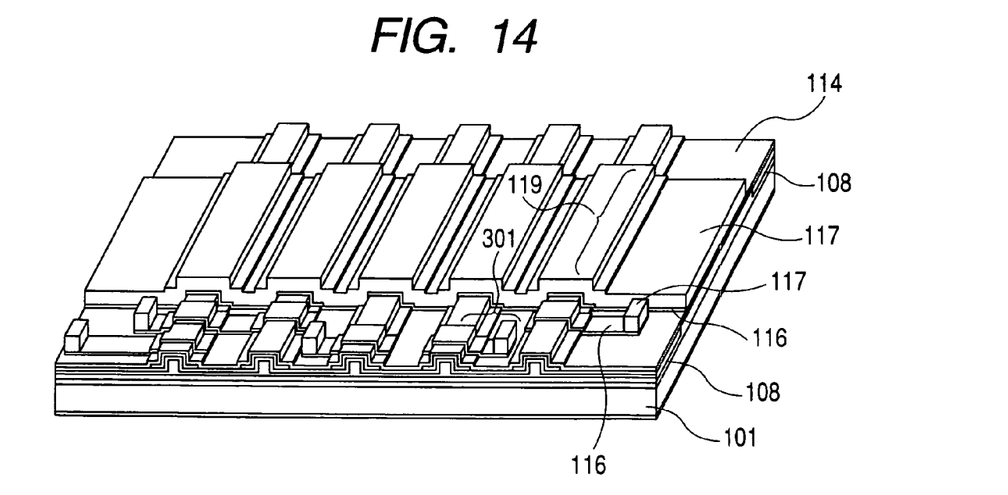
FIG. 14 is a perspective view showing a completed laser chip in the third embodiment.

By reference to FIGS. 13 to 15, a third embodiment of the present invention will be explained hereunder. In the embodiment, such a structure is manufactured that joining structures 301 for the submounts 124 and the laser chips 121 are provided on the non-energized portions of the semiconductor laser similar to the structure in Embodiment 1 at the interval that is wider than the interval of the stripe-like waveguide structures 111. In the present structure, the steps required until the $SiO_2$ interlayer insulating film 114 is formed are similar to those for the structure in Embodiment 1. As shown in FIG. 13, in place of the projection structures used for alignment, a multi-layered wiring structure used to allow a wider area of the joining structure 301 to the submount 124 than the interval of the laser waveguide is formed in the window areas. Also, the structure that the contact holes 115 are provided in the $SiO_2$ interlayer insulating film 114 is similar to Embodiment 1. In the embodiment, positions of the contact holes 115 are shifted so that the second electrodes 116 are not contact with each other.

Then, the second electrodes 116 are formed by forming the Ti (titanium) deposited electrode (not shown) and the Au (gold) deposited electrode (not shown) in order by using the EB deposition method, or the like. Then, the resist mask is formed on the electrodes by the photolithography technology, and then the patterning of the second electrodes 116 is executed by the ion milling while using the resist pattern formed by the photolithography as a mask. Thus, a structure shown in FIG. 14 is formed. The plated electrodes 117 are divided into two structures. That is, the plated electrodes 117 are provided in the window areas 108 as the joining structure 301 for electrically connecting with the submount side electrode, and provided in areas except the windows to cover the stripe-like waveguide structures 111 as the chip fixing structure 119 for fixing the laser chip 121 onto the submount 124 and for releasing the heat of the waveguide to the submount but not for energizing the waveguide.

Figure 15:
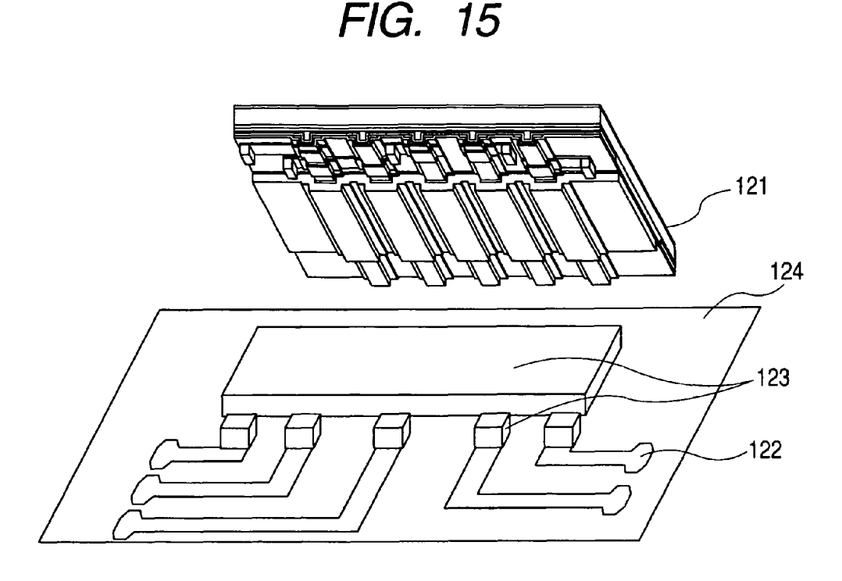
FIG. 15 shows an assembling operation of the third embodiment.

Then, as shown in FIG. 15, the laser structure manufactured as described above is bonded to the submount 124, on which the electrodes and the solder layers having the patterns corresponding to respective electrodes are provided, to direct the joining surface downward. In the bonding step at this time, first the laser chip 121 whose joining surface is directed downward is held to oppose to the submount 124, then is brought once into contact with the submount 124 to check that their assembling positions are matched correctly, and then a load of 10 g is applied to the laser chip 121 to temporarily bond the solder and the plated electrode. At this time, the interval between the joining structure 301 and the solder layer 123 on the subsmount side is widened rather than the essential channel interval because of the pattern of the second electrode 116, and therefore accuracy of the assembling position required for the bonding is relaxed. In the above explanation, the array laser having 5 channels is illustrated to avoid complexity of the drawings. However, the multi-channel array laser having 40 channels and the spot interval of 15 μm can be manufactured by using the similar configuration with good yield.

Embodiment 4

Figure 16:
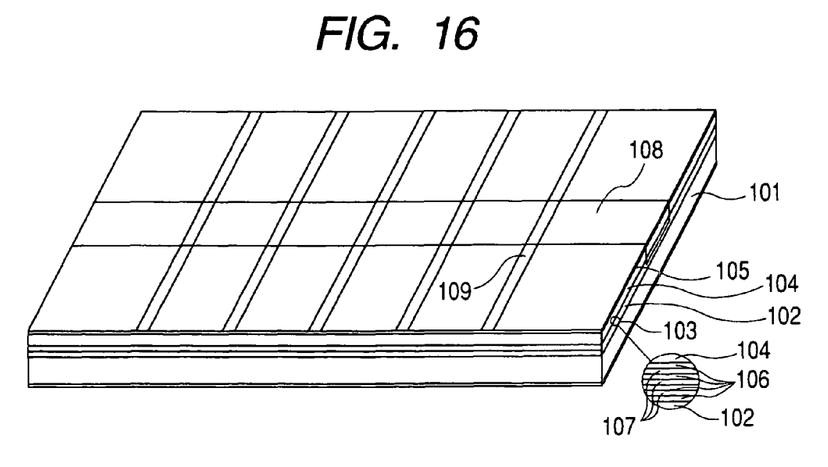
FIG. 16 is a perspective view of a structure after contact holes of a laser in a fourth embodiment are formed.
Figure 17:
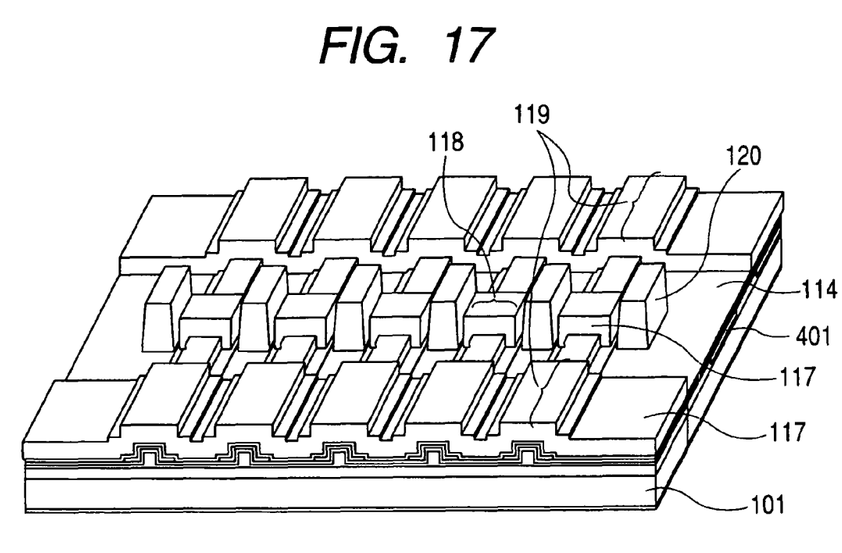
FIG. 17 is a perspective view showing a completed laser chip in the fourth embodiment.

Embodiment 4 of the present invention will be explained with reference to FIGS. 16 to 18 hereunder. In the above embodiments, an example in which the window area 108 for which there is no need to consider the heat generation is formed on the end surfaces of the semiconductor laser is described. In the application in which the relatively low output is used and the end surface protection is not needed, the window area can be formed in the center of the laser chip. A basic manufacturing method for the present structure is similar to Embodiment 1. In the embodiment, as shown in FIG. 16, a window area 401 is provided in the center portion of the laser chip in the direction along which the stripe-like waveguide structures 111 are extended. In the case of this structure, as shown in FIG. 17, the chip fixing structure 119 formed by the gold plating is formed in the area except the window areas on both end of the chip.

In the case of the embodiment, an occupation ratio of the window area 401 to the overall chip is increased (for example, 250 μm out of the resonator length of 400 μm), and the light absorption in the window area 401 must be reduced smaller than the case of Embodiment 1. For this reason, in the embodiment, in order to prevent the free carrier absorption in the window area, a carrier density in the window area 401 is reduced lower than $1 \times 10^{17}$ cm$^{-3}$ by executing the ion implantation of the element such as hydrogen, lithium, silicon, oxygen, or the like after the multiple quantum well active layer is disordered by the zinc diffusion. These elements are coupled to the doped impurity in the semiconductor crystal to inactivate the impurity, while not generating the deep crystal defect that causes the light absorption. Thus, these elements are suitable to produce the effect of preventing the free carrier absorption by reducing a carrier density in the window area 401. The process using the ion implantation has an excellent controllability in introducing these elements. In the case of the hydrogen, the hydrogen can be introduced by exposing the crystal of the window area 401 to the hydrogen plasma generated by the electric discharge or the chemical reaction. Also, in the case of the lithium or gallium holes, the process of introducing them from the metal film deposited on the window area 401 or the silicon oxide film by the low temperature diffusion is effective. These processes can be realized with a simple equipment respectively. A reduction of the light absorption in the window area 401 is effective in improving the characteristic in Embodiments 1 to 3 in which a ratio of the window area 401 is smaller.

Figure 18:
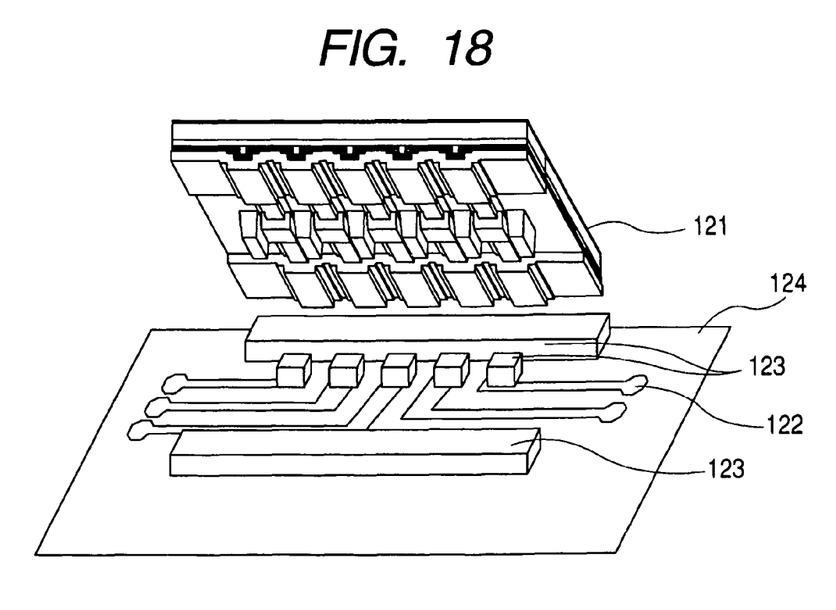
FIG. 18 shows an assembling operation of the fourth embodiment.

In the case of the embodiment, in the device assembling operation, as shown in FIG. 18, precise alignment between the submount 124 and the laser chip 121 can be realized by fixing the laser chip 121 to the submount 124 via the chip fixing structures 119 on both ends of the laser chip 121 and then fitting the projections 120 formed between the chip fixing structures 119 into the solder layers 123 of the submount 124. When the submount 124 and the laser chip 121 are heated up to a temperature in excess of a fusing temperature of the solder after the stage that the positioning is completed, the submount 124 and the laser chip 121 can be rendered conductive via the joining structures 118. In the case of the embodiment, since the projections 120 for use in the position adjustment to the submount 124 are provided only in the center of the chip, a cost of the device can be reduced because the aligning step prior to the soldering is made simple. Also, in the case of the present structure, the heat generating areas gathered in the center of the device in Embodiment 1 can be separated to both end surfaces of the laser chip, so that the effect of two-dimensional spread in the heat radiating process can be increased and also the present structure is effective in improving the heat radiation performance.

Embodiment 5

Figure 19:
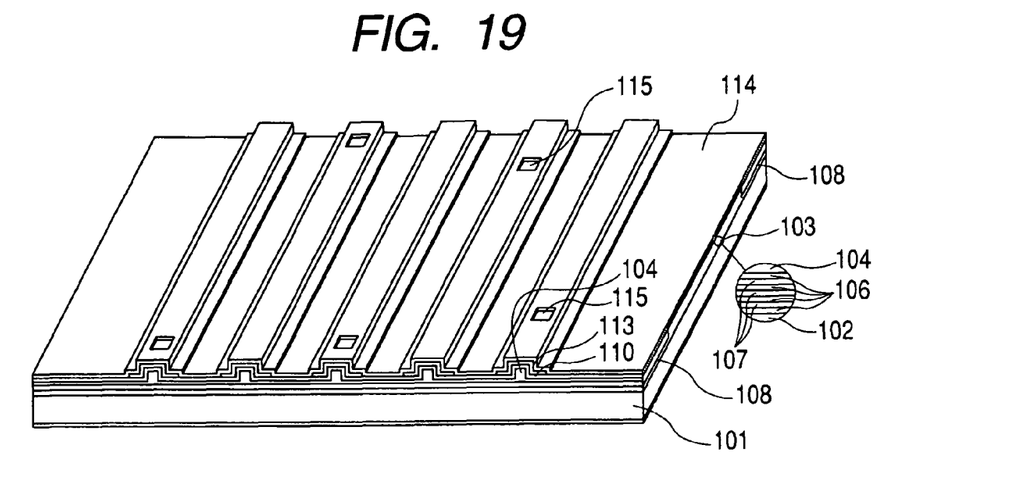
FIG. 19 is a perspective view of a structure after contact holes of a laser in a fifth embodiment are formed.
Figure 20:
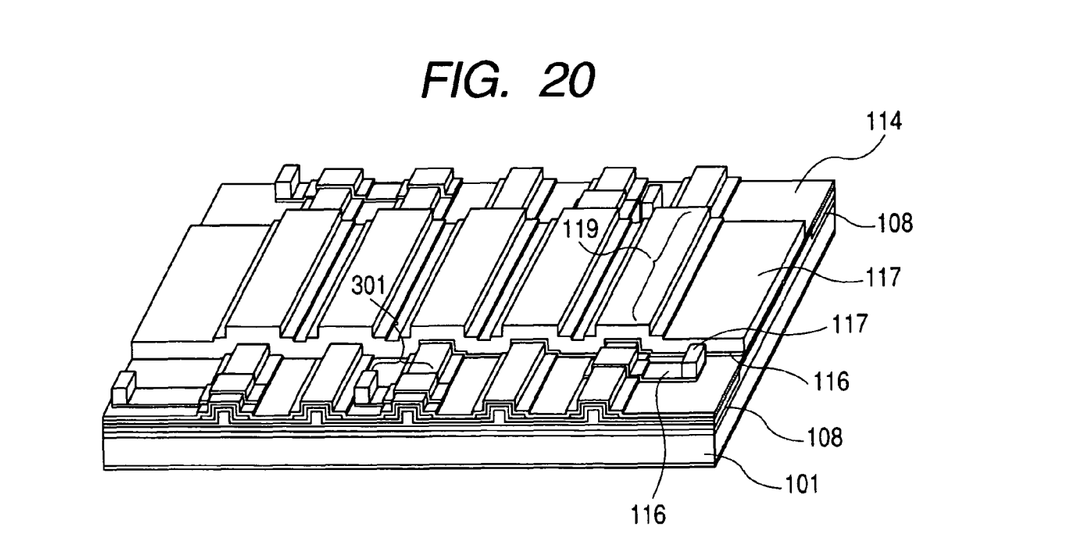
FIG. 20 is a perspective view showing a completed laser chip of the laser in the fifth embodiment.

A fifth embodiment of the present invention will be explained with reference to FIGS. 19 to 21 hereunder. In the embodiment, such a structure is manufactured that the joining structures 301 of the submount 124 and the laser chip 121 are provided in the non-energized portion of the semiconductor laser similar to the structure in Embodiment 3 at the interval that is wider than the interval between the stripe-like waveguide structures 111. In the present structure, steps required until the SiO$_2$ interlayer insulating film 114 is formed are similar to the structure in Embodiment 1. As shown in FIG. 20, in place of the projection structures used for alignment, a multi-layered wiring structure used to allow a wider area of the joining structure 301 to the submount 124 than the interval of the laser waveguide is formed in the window areas. Also, the structure for providing the contact holes 115 in the SiO$_2$ interlayer insulating film 114 is similar to Embodiment 1. In the embodiment, positions of the contact holes 115 are shifted so that the second electrodes 116 are not contact with each other.

Then, the second electrodes 116 are formed by forming the Ti (titanium) deposited electrode (not shown) and the Au (gold) deposited electrode (not shown) in order by using the EB deposition method, or the like. Then, the resist mask is formed on the electrodes by the photolithography technology, and then the patterning of the second electrodes 116 is executed by the ion milling while using the resist pattern formed by the photolithography as a mask. Thus, a structure shown in FIG. 20 is formed. The plated electrodes 117 are divided into two structures. That is, the plated electrodes 117 are provided in the window areas 108 as the joining structure 301 for electrically connecting with the submount side electrode, and provided in areas except the windows to cover the stripe-like waveguide structures 111 as the chip fixing structure 119 for fixing the laser chip 121 onto the submount 124 and for releasing the heat of the waveguide to the submount but not for energizing the waveguide.

Figure 21:
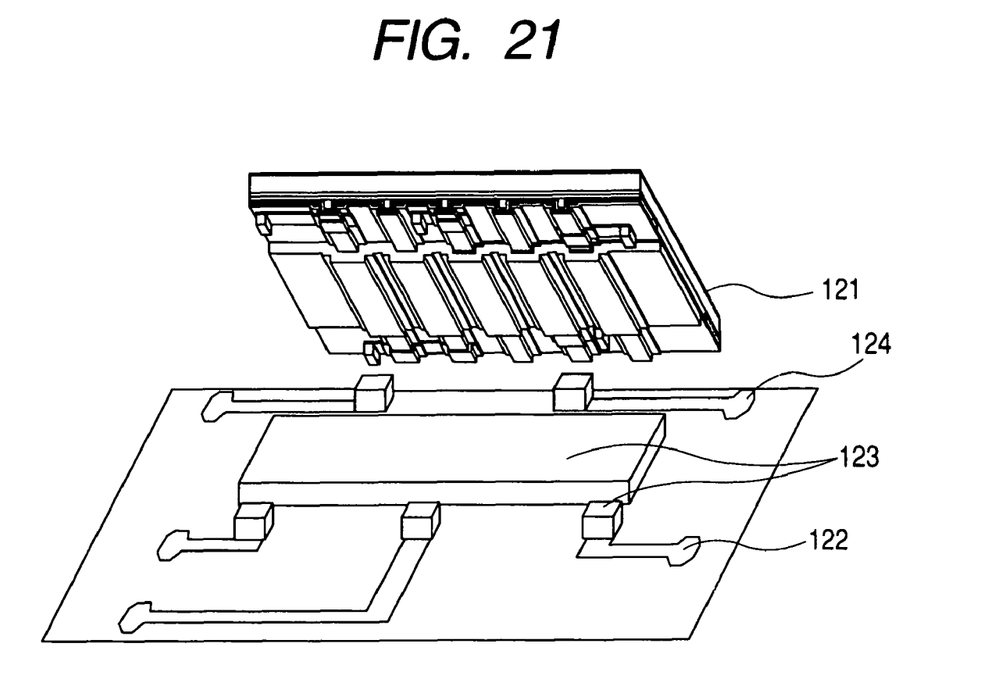
FIG. 21 shows an assembling operation of the fifth embodiment.

Then, as shown in FIG. 21, the laser structure manufactured as described above is bonded to the submount 124, on which the electrodes and the solder layers having the patterns corresponding to respective electrodes are provided, to direct the joining surface downward. In the bonding step at this time, first the laser chip 121 whose joining surface is directed downward is held to oppose to the submount 124, then is brought once into contact with the submount 124 to check that their assembling positions are matched correctly, and then a load of 10 g is applied to the laser chip 121 to temporarily bond the solder and the plated electrode. At this time, the interval between the joining structure 301 and the solder layer 123 on the submount side is widened rather than the essential channel interval because of the pattern of the second electrode 116, and therefore accuracy of the assembling position required for the bonding is relaxed. In the above explanation, the array laser having 5 channels is illustrated to avoid complexity of the drawings. However, the multi-channel array laser having 40 channels and the spot interval of 15 μm can be manufactured by using the similar configuration with good yield.

What is claimed is:

1. A method for assembling a semiconductor laser device, said method comprising:
preparing a semiconductor laser chip that includes:
a semiconductor substrate comprising a gain producing area and a window area;
a plurality of stripe waveguides that are formed on the semiconductor substrate in parallel at a first interval and that each includes a part of the gain producing area and a part of window area;
a plurality of first electrodes that are formed on the plurality of stripe waveguides, respectively;
an insulating layer that is formed on the plurality of first electrodes;
a metal layer that is formed on the insulating layer;
a plurality of joining structures that are formed on first positions above the window area so as to be connected to the plurality of first electrodes, respectively; and
a plurality of alignment projections that are formed on second positions above the window area and that are arranged at a second interval, the first positions and the second positions being different from one another;
preparing a submount that includes:
a first solder layer;
a plurality of second solder layers that are arranged at the second interval; and
a plurality of submount electrodes that are connected to the plurality of second solder layers, respectively;
aligning the laser chip with the submount by fitting the plurality of alignment projections into spaces between the plurality of second solder layers;
bringing the semiconductor laser chip into contact with the submount so that the metal layer contacts the first solder layer and so that the plurality of joining structures contact the plurality of second solder layers; and
heating the submount and the semiconductor laser chip to fuse the first solder layer and the plurality of second solder layers.

2. The method according to claim 1, wherein the plurality of alignment projections are each formed in a tapered-down shape.

3. The method according to claim 1, wherein the plurality of joining structures comprise a metal, and
wherein the plurality of joining structures each comprises a cavity defined thereinside.

4. The method according to claim 1, further comprising:
diffusing an impurity for forming the window areas by disordering a superlattice structure; and
introducing atoms of hydrogen, lithium, or oxygen for reducing an impurity concentration to be lower than $1 \times 10^{17}$ cm$^{-3}$ after a quantum well disordering.

5. The method according to claim 1, wherein, in each of the plurality of stripe waveguides, the window area is formed at both ends thereof, and
wherein the plurality of alignment projections are formed in the window areas at the both ends, and
wherein the plurality of second solder layers are formed in two rows on the submount to correspond to the plurality of alignment projections.

6. The method according to claim 5, further comprising:
detecting a rotational displacement between the submount and the semiconductor laser chip in discrete angles corresponding to the second interval.

7. The method according to claim 1, wherein, in each of the plurality of stripe waveguides, the window area is formed at one portion thereof.

8. The method according to claim 1, wherein the semiconductor laser chip includes:
a first cladding layer that is formed on the semiconductor substrate;
an active layer that is formed on the first cladding layer; and
a second cladding layer that is formed on the active layer, and
wherein the first cladding layer, the active layer and the second cladding layer form the plurality of stripe waveguides.

9. A method for assembling a semiconductor laser device, said method comprising:
preparing a semiconductor laser chip that includes:
a semiconductor substrate comprising a gain producing area and a window area;
a plurality of stripe waveguides that are formed on the semiconductor substrate in parallel at a first interval and that each includes a part of the gain producing area and a part of the window area;
a plurality of first electrodes that are formed on the plurality of stripe waveguides, respectively;
an insulating layer that is formed on the plurality of first electrodes;
a metal layer that is formed on the insulating layer; and
a plurality of joining structures that are connected to the plurality of first electrodes, respectively, that are formed in the window areas at a second interval being broader than the first interval and that are shifted so as not to contact with each other;
preparing a submount that includes:
a first solder layer;
a plurality of second solder layers; and
a plurality of submount electrodes that are connected to the plurality of second solder layers, respectively;
bringing the semiconductor laser chip into contact with the submount so that the metal layer contacts the first solder layer and so that the plurality of joining structures contact the plurality of second solder layers; and
heating the submount and the semiconductor laser chip to fuse the first solder layer and the plurality of second solder layers.

10. The method according to claim 9, further comprising:
diffusing an impurity for forming the window areas by disordering a superlattice structure; and
introducing atoms of hydrogen, lithium, or oxygen for reducing an impurity concentration to be lower than $1 \times 10^{17}$ cm$^{-3}$ after a quantum well disordering.

11. The method according to claim 9, wherein the window area is formed on both end portions of the semiconductor laser chip,
wherein the plurality of joining structures are formed in the window area at one end portion of the semiconductor laser chip,
wherein a plurality of projections are formed in the window area at the both end portions of the semiconductor laser chip, and
wherein, on the submount, the plurality of second solder layers are formed to correspond to the plurality of projections.

12. The method according to claim 9, wherein the semiconductor laser chip includes:
a first cladding layer that is formed on the semiconductor substrate;
an active layer that is formed on the first cladding layer; and
a second cladding layer that is formed on the active layer, and
wherein the first cladding layer, the active layer and the second cladding layer form the plurality of stripe waveguides.

* * * * *